United States Patent
Ogawa et al.

(10) Patent No.: US 7,517,468 B2
(45) Date of Patent: Apr. 14, 2009

(54) ETCHING METHOD

(75) Inventors: Shuhei Ogawa, Yamanashi-ken (JP);
Koichiro Inazawa, Beverly, MA (US);
Rie Inazawa, legal representative,
Yamanashi-Ken (JP)

(73) Assignee: Tokyo Electron Limited, Tokyo (JP)

( * ) Notice: Subject to any disclaimer, the term of this patent is extended or adjusted under 35 U.S.C. 154(b) by 0 days.

(21) Appl. No.: 10/522,569

(22) PCT Filed: Aug. 5, 2003

(86) PCT No.: PCT/JP03/09941

§ 371 (c)(1),
(2), (4) Date: Nov. 17, 2005

(87) PCT Pub. No.: WO2004/013905

PCT Pub. Date: Feb. 12, 2004

(65) Prior Publication Data

US 2006/0118517 A1    Jun. 8, 2006

(30) Foreign Application Priority Data

Aug. 5, 2002    (JP)    ............................. 2002-227753

(51) Int. Cl.
*G01L 21/30* (2006.01)
*C23F 1/00* (2006.01)

(52) U.S. Cl. .................. 216/67; 216/59; 257/E21.256; 257/E21.257

(58) Field of Classification Search ........................ None
See application file for complete search history.

(56) References Cited

U.S. PATENT DOCUMENTS

| | | | |
|---|---|---|---|
| 5,776,764 A | 7/1998 | Ueta et al. | |
| 6,069,090 A * | 5/2000 | Eriguchi | 438/714 |
| 6,326,302 B1 | 12/2001 | Joubert et al. | |
| 6,869,542 B2 * | 3/2005 | Desphande et al. | 216/51 |

(Continued)

FOREIGN PATENT DOCUMENTS

JP    02-148039    6/1990

(Continued)

OTHER PUBLICATIONS

International Preliminary Examination Report (PCT/IPEA/409) (translated) issued fot PCT/JP2003/009941.

(Continued)

*Primary Examiner*—Allan Olsen
(74) *Attorney, Agent, or Firm*—Smith, Gambrell & Russell, LLP

(57) ABSTRACT

The present invention is a method of etching a lower layer film (64) of an organic material formed on a surface layer (61) of a substrate, using an upper layer film (63) of an Si-containing organic material as a mask. A mixed gas containing an $NH_3$ gas and an $O_2$ gas is supplied into the processing vessel as an etching gas, so as to perform etching by a plasma of the etching gas. When the etching gas is supplied into the processing vessel, a CD shift value of etching can be controlled by adjusting a flow ratio of $O_2$ gas to the $NH_3$ gas. Specifically, a satisfactory CD shift value can be obtained when the flow ratio is from 0.5 to 20%, and preferably, 5 to 10%.

11 Claims, 3 Drawing Sheets

CD SHIFT VALUE = BOTTOM CD − TOP CD

U.S. PATENT DOCUMENTS

2003/0159782 A1* 8/2003 Brcka .................... 156/345.48

FOREIGN PATENT DOCUMENTS

| JP | 2000-269184 | 9/2000 |
| JP | 2000-269185 | 9/2000 |
| JP | 2001-308175 | 11/2001 |
| JP | 2002-093778 | 3/2002 |
| TW | 417039 | 1/2001 |

OTHER PUBLICATIONS

Notification of Transmittal of Copies of Translation of the International Preliminary Examination Report (PCT/IB/338) issued for PCT/JP2003/009941.

* cited by examiner

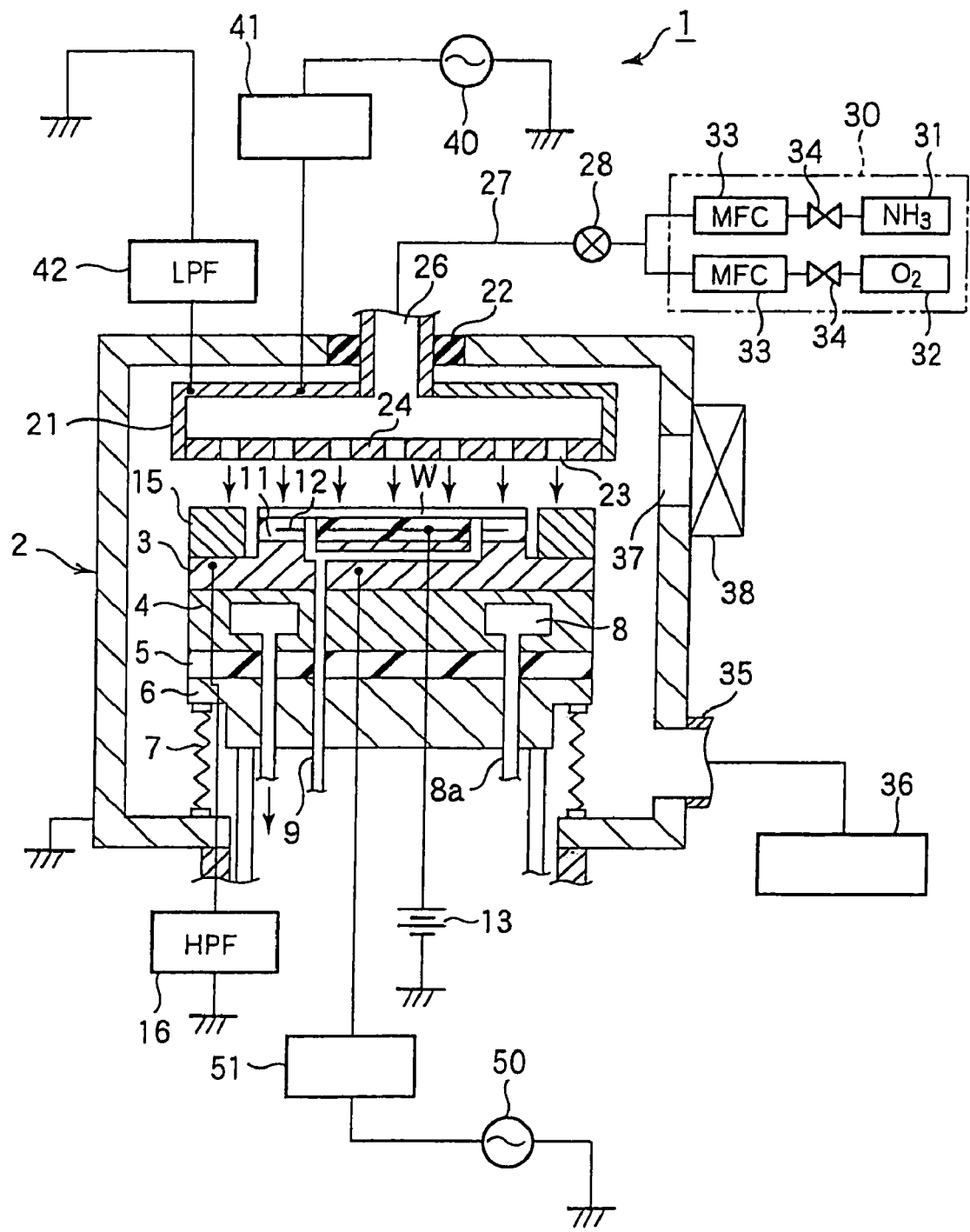
F I G. 1

CD SHIFT VALUE = BOTTOM CD − TOP CD

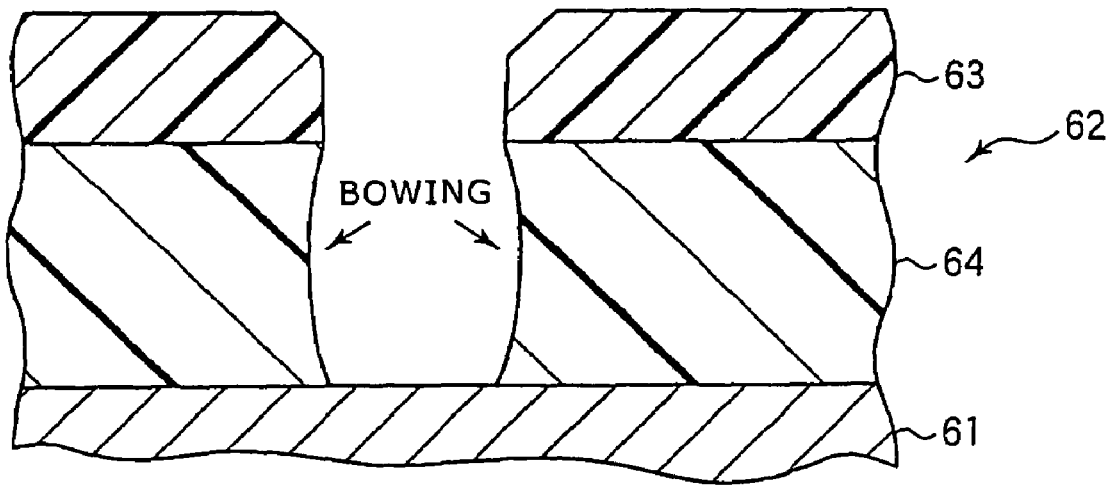
F I G. 4
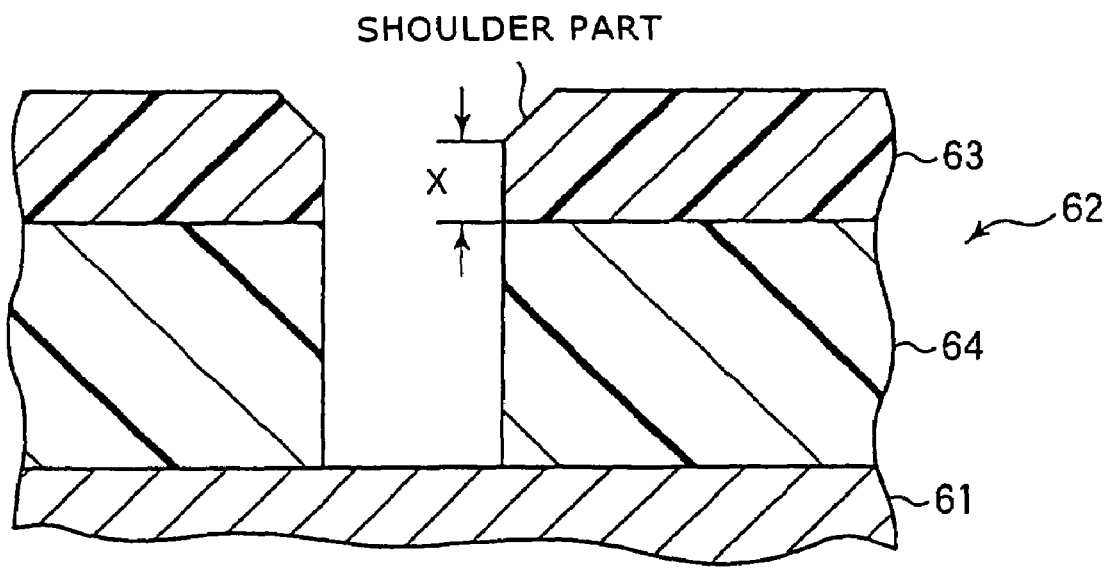
F I G. 5

ETCHING METHOD

TECHNICAL FIELD

The present invention relates to a method of etching, for example, a lower layer resist of a double-layered resist. More particularly, it pertains to a method of plasma-etching a lower layer film of an organic material formed on a substrate, using an upper layer film of an Si (silicon)—containing organic material as a mask.

BACKGROUND ART

A highly integrated semiconductor device has been desired in recent years, and thus there is a need for forming a finer pattern. In a photolithography process, in order to obtain a higher resolution for a finer pattern, it is necessary to reduce a thickness of a resist film formed on a semiconductor wafer, which is used when a pattern is formed thereon by dry-etching.

However, when a thickness of a resist film is reduced so as to form a finer pattern, a sufficient etching selectivity of a film to be etched cannot be taken relative to the resist film, which results in poor patterning.

In order to avoid this disadvantage, a double-layered resist has been conventionally used. The double-layered resist is manufactured by, for example, forming a lower layer resist film for planarization on a film to be etched, and forming, on the lower layer resist film, a photosensitive resist film as an upper layer resist film.

In the double-layered resist, the upper photosensitive resist film contains Si. A resist pattern is formed on the photosensitive resist film by exposure and development. Then, the lower layer resist film is etched (dry-developed), using the patterned upper layer resist film as a mask. Finally, the film to be etched is etched, using the upper layer resist and the lower layer resist as a mask.

In a series of these etching steps, when the lower layer resist film is etched with the upper layer resist film used as a mask, an $O_2$-based gas mainly containing $O_2$ has been conventionally used. Since $SiO_2$ is generated on the upper layer resist film by the $O_2$-based gas, the lower layer resist can be etched at a high selectivity relative to the upper layer resist. Thus, a thickness of a residual film of the upper layer resist film can be increased.

However, when a film is etched by using the $O_2$-based gas, etching cannot be accurately performed, and thus an accurate pattern cannot be obtained. To be specific, as shown in FIG. 4, a longitudinal section of the etched part has a so-called bowing shape which degrades a controllability of a CD (Critical Dimension) shift value. As shown in FIG. 3, the term "CD shift value" herein means a value obtained by subtracting an uppermost CD value (top CD) of an etched organic material layer 64 from a lowermost CD value (bottom CD) thereof. Thus, the CD shift value takes a plus (+) value when a bottom part is wider than a top part, while it takes a minus (−) value when the bottom part is narrower than the top part.

A use of a mixed gas containing an $H_2$ gas and an $N_2$ gas as an etching gas has been considered. When such a mixed gas is used, etching can be accurately performed to provide a well-shaped pattern, because a bowing does not readily occur and the CD shift can be restrained.

However, a use of the mixed gas containing the $H_2$ gas and the $N_2$ gas lowers an etching selectivity of the lower layer resist relative to the upper layer resist. Thus, a thickness of the upper layer resist is unavoidably decreased when the lower layer resist is etched, which impairs the advantages of the double-layered resist.

DISCLOSURE OF INVENTION

The present invention has been made in view of the above difficulties. An object of the present invention is to provide a method of etching a lower layer film of an organic material, using an upper layer film of an Si-containing organic material as a mask, in which the lower layer film can be accurately etched at a satisfactory selectivity, so that a well-shaped pattern can be realized.

With a view to achieving this object, the inventors of the present invention have conducted research and found that, when a mixed gas containing an $NH_3$ gas and an $O_2$ gas is used for etching the lower layer film, a CD shift value can be controlled at a desired value, so that etching can be accurately performed to provide a well-shaped pattern, while maintaining a satisfactory selectivity.

The present invention is accomplished based on this investigation, and provides a method of etching, by a plasma of an etching gas in a processing vessel, a lower layer film of an organic material formed on a substrate, using an upper layer film of an Si-containing organic material as a mask, wherein a mixed gas containing an $NH_3$ gas and an $O_2$ gas is supplied into the processing vessel as the etching gas, and a CD shift value of etching is controlled by adjusting a flow ratio of the $O_2$ gas to the $NH_3$ gas.

Japanese Patent Laid-Open Publication No. 280316/1989 (JP 01-280316 A) discloses a use of the $NH_3$ gas and the $O_2$ gas when etching a lower layer resist of a double-layered resist. However, it simply describes that a gas containing $NH_3$ is effective in etching an organic film at a high etching rate. In this publication, the $O_2$ gas is nothing more than one of gases added to the $NH_3$ gas. No consideration is made about an addition of $O_2$ gas to the $NH_3$ gas, as described in the present invention, so as to control a CD shift value. Therefore, the art disclosed in Japanese Patent Laid-Open Publication No. 280316/1989 is completely different from that of the present invention.

The present invention provides a method of etching, by a plasma of an etching gas in a processing vessel, a lower layer film of an organic material formed on a substrate, using an upper layer film of an Si-containing organic material as a mask, wherein a mixed gas containing an $NH_3$ gas and an $O_2$ gas is supplied into the processing vessel as the etching gas, and a flow ratio of the $O_2$ gas to the $NH_3$ gas is from 0.5 to 20%.

According to the present invention, the $O_2$ gas can more effectively work in the etching process, and a satisfactory CD shift value can be obtained. In addition, a generation of etching residue can be restrained. In this case, it is preferable that the flow ratio of the $O_2$ gas to the $NH_3$ gas is from 5 to 10%.

It is preferable that, in the above etching method, a pressure in the processing vessel is not less than 2.7 Pa and less than 13.3 Pa.

It is preferable that a temperature of a support member supporting the substrate in the processing vessel is from 0 to 20° C.

Further, it is preferable that the plasma is formed between a pair of opposed electrodes disposed in the processing vessel, and that a residence time represented by V/S takes a value from 20 to 60 msec, where V ($m^3$) represents an effective processing space volume as a product of an area of the substrate and a distance between the electrodes, and S ($m^3$/sec) represents a gas exhaust velocity from the processing vessel.

The substrate may have a surface layer to be etched with the lower layer film used as a mask, the surface layer being formed under the lower layer film.

The etching method according to the present invention can be carried out by a capacitively coupled plasma etching system, which forms a high-frequency electric field between a pair of opposed electrodes disposed in the processing vessel to generate the plasma.

BRIEF DESCRIPTION OF DRAWINGS

FIG. 1 is a sectional view of an etching system for carrying out an etching method according to the present invention;

FIG. 4 is a sectional view illustrating a bowing; and

FIG. 5 is a sectional view illustrating a residual shoulder part.

BEST MODE FOR CARRYING OUT THE INVENTION

Figure 2:
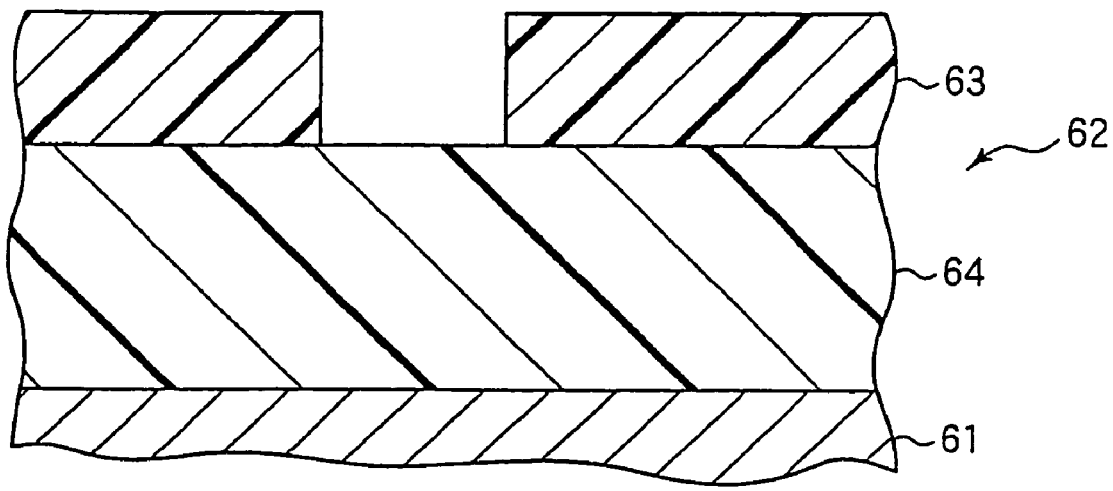
FIG. 2 is a sectional view of a structure of a two-layered resist to which an etching method in one embodiment of the present invention is applied.
Figure 3:
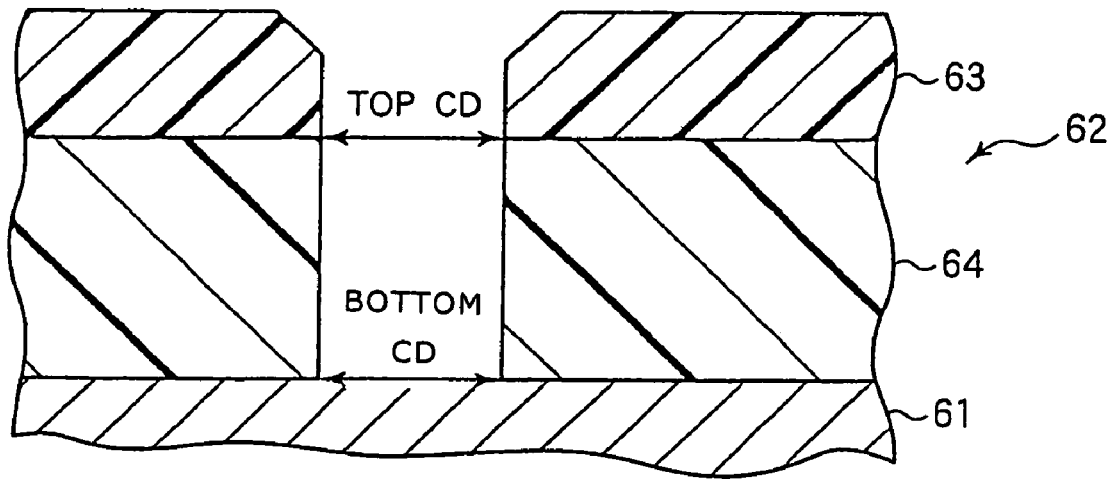
FIG. 3 is a sectional view illustrating a CD shift value.

An embodiment of the present invention will be described in detail below, with reference to the accompanying drawings.

[Etching System]

FIG. 1 is a sectional view schematically showing a plasma etching system for carrying out the present invention. The plasma etching system 1 shown in FIG. 1 is of a capacitively-coupled, parallel flat-plate type, and includes a pair of vertically opposed electrodes arranged in parallel with each other. A power source for generating a plasma is connected to one of the electrodes.

The plasma etching system 1 includes a cylindrical processing vessel 2 made of aluminum having its surface thermally sprayed by ceramics. The processing vessel 2 is protectively grounded. The processing vessel 2 is provided with a susceptor 3 supported by a support member 4. The susceptor 3 serves as a lower electrode. A semiconductor wafer W is horizontally mounted on the susceptor 3. The wafer W is made of Si, for example, and has on its surface a laminate structure which is described below. The support member 4 is supported by a support table 6 of an elevating mechanism (not shown) through an insulating plate 5 made of, e.g., ceramics. Thus, the susceptor 3 can be vertically moved. A lower center portion of the support table 6 is air-tightly surrounded by a bellows 7.

A refrigerant chamber 8 is formed in the support member 4. A coolant such as Galden® is introduced to the refrigerant chamber 8 through a coolant inlet tube 8a, and is circulated in the refrigerant chamber 8. The cooled temperature is transmitted to the wafer W through the susceptor 3. In this manner, a surface to be processed of the wafer W can be controlled at a desired temperature. A gas passage 9 is disposed on a back surface of the wafer W, for supplying a heat transmission medium such as an He gas. Thus, in the vacuumized processing vessel 2, the wafer W can be effectively cooled by the coolant circulating the refrigerant chamber 8. The cooled temperature of the susceptor 3 is effectively transmitted to the wafer W through the heat transmission medium, so that the temperature of the wafer W can be precisely controlled.

The susceptor 3 is of an upwardly convex disc shape. On the susceptor 3, there is disposed an electrostatic chuck 11 which is formed by arranging an electrode 12 in an insulating material. The electrostatic chuck 11 attracts and holds the wafer W by means of, e.g., Coulomb force, when applying direct-current electricity from the direct-current power source 13 to the electrode 12. A focus ring 15 for improving an etching uniformity is disposed on an upper periphery of the susceptor 3 to surround the wafer W mounted on the electrostatic chuck 11.

A showerhead 21 serving as an upper electrode is arranged above the susceptor 3 such that the showerhead 21 is opposed in parallel with the susceptor 3. The showerhead 21 is supported on an upper part of the processing vessel 2 though an insulating material 22. The showerhead 21 has a plurality of discharge holes 23 in its surface 24 which is opposed to the susceptor 3. The surface of the wafer W and the showerhead 21 are spaced apart from each other by about 30 mm to 90 mm, for example. The distance therebetween can be adjusted by the elevating mechanism.

A gas inlet port 26 is formed in a center portion of the showerhead 21. A gas supply pipe 27 is connected to the gas inlet port 26. An etching gas supply system 30 is connected to the gas supply pipe 27 via a valve 28. The etching gas supply system 30 is provided with an $NH_3$ gas supply source 31 and an $O_2$ gas supply source 32. A mass flow controller 33 and a valve 34 are disposed on each pipe extended from the respective gas sources 31 and 32.

The $NH_3$ gas and the $O_2$ gas as an etching gas are supplied from the respective gas sources 31 and 32 into a space formed in the showerhead 21 through the gas supply pipe 27 and the gas inlet port 26, and then discharged into the processing vessel 2 through the gas discharge holes 32.

An exhaust pipe 35 is connected to a part near a bottom of a sidewall of the processing vessel 2. An exhaust system 36 is connected to the exhaust pipe 35. The exhaust system 36 is provided with a vacuum pump such as a turbo-molecular pump. Thus, the processing vessel 2 is capable of forming a vacuum at a predetermined decompressed atmosphere, e.g., at a pressure of equal to or less than 1 Pa. A port 37 for loading/unloading the wafer W, and a gate valve 38 for opening/closing the loading/unloading port 37 are disposed on the sidewall of the processing vessel 2. The wafers W are transferred between the processing vessel 2 and an adjacent load lock chamber (not shown) via the loading/unloading port 37, with the gate valve 38 being opened.

A high-frequency power source 40 is connected via a matching device 41 to the showerhead 21 functioning as an upper electrode. The high-frequency power source 40 supplies a high-frequency power of, e.g., 60 MHz frequency to the showerhead 21 as an upper electrode, whereby a high-frequency electric field for generating a plasma is formed between the showerhead 21 as an upper electrode and the susceptor 3 as a lower electrode. A lowpass filter (LPF) 42 is connected to the shower head 21.

A high-frequency power source 50 is connected through a matching device 51 to the susceptor 3 functioning as a lower electrode. The high-frequency power source 50 supplies high-frequency power of, e.g., 2 MHz frequency to the susceptor 3 as a lower electrode, whereby ions in the plasma are drawn toward the wafer W so that a highly anisotropic etching can be realized. A highpass filter (HPF) 16 is connected to the susceptor 3.

[Etching Method]

A method of etching a lower layer resist film of a two-layered resist, which is carried out by the plasma etching system as constituted above, will be described below.

(Outline of Etching)

FIG. 2 is a sectional view showing an example of a structure having a two-layered resist to be etched. The structure includes a surface layer 61 formed on a surface of the wafer W, and a two-layered resist 62 formed on the surface layer 61. The two-layered resist 62 has a photosensitive resist film 63 as an upper layer resist film of an Si-containing organic material, and an organic material film 64 as a lower layer resist film.

A predetermined pattern is formed on the photosensitive resist film 63 by exposure and development. The organic material film 64 is etched (dry-developed), using the photosensitive resist film 63 as a mask. Thereafter, the photosensitive resist film 63 and the etched organic material film 64 are used as a mask, when the surface layer 61 is etched.

The organic material film 64 as a lower layer resist film does not need to have photosensitivity, but must have a high etching selectivity relative to the surface layer 61 as an undercoat. The organic material film 64 may contain C and H, as well as O. From a view point of raising an etching selectivity to increase a film thickness of the organic material film 64, the organic material film 64 is preferably rich in C.

A suitable material of the surface layer 61 of the wafer W is at least one selected from materials for an interlayer insulation film such as SiON, SiN, SiC, TiN, $SiO_2$, SiOC, and so on.

In order to precisely transfer a finer pattern formed on the photoresist film 63 to the surface layer 61, the organic material film 64 must be accurately etched at a high selectivity to provide a well-shaped pattern, using the photosensitive resist film 63 as a mask.

(Etching Operation)

In order to perform the above-described etching by means of the plasma etching system 1 shown in FIG. 1, the following series of operations are carried out. At first, by opening the gate valve 38, the wafer W is loaded into the processing vessel 2 to be mounted on the susceptor 3. After the gate valve 38 is closed, the susceptor 3 is raised such that a distance between the surface of the wafer W mounted on the susceptor 3 and the showerhead 21 is in the range of about 30 to 90 mm. Then, air in the processing vessel 2 is evacuated by the exhaust system 36 to reduce a pressure therein. Thereafter, a direct-current electricity is applied by the direct-current power source 13 to the electrode 12 in the electrostatic chuck 11.

Subsequently, the mixed gas containing the $NH_3$ gas and the $O_2$ gas as an etching gas is introduced from the etching gas supply system 30 into the processing vessel 2. By applying a high-frequency power from the high-frequency power source 40 to the showerhead 21, a high-frequency electric field is formed between the showerhead 21 as an upper electrode and the susceptor 3 as a lower electrode. Thus, a plasma of the etching gas (the mixed gas containing the $NH_3$ gas and the $O_2$ gas) is generated between the upper and the lower electrodes 21 and 3. Because of a generation of the plasma, the wafer W is electrostaticly absorbed on the electrostatic chuck 11.

Then, the organic material film 64 is etched by using the thus generated plasma of the etching gas. To this end, a high-frequency power of a predetermined frequency is applied to the susceptor 3 as a lower electrode from the high-frequency power source 50 to thereby draw ions in the plasma toward the susceptor 3.

In etching the organic material film 64, a flow ratio of the $O_2$ gas to the $NH_3$ gas is adjusted such that a desired CD shift value can be obtained. It is possible to etch the organic material film 64 only by the $NH_3$ gas at a high selectivity relative to the photosensitive resist film 63. However, when only the $NH_3$ gas is used, a lack of etching may occur, and thus a width of the etched part is apt to be smaller. Then, a satisfactory CD shift value cannot be obtained. In addition, an etching residue is prone to be remained. On the other hand, when a suitable amount of $O_2$ gas is added to the $NH_3$ gas, etching is accelerated, so that a desired CD shift value can be obtained. Further, an etching residue is rarely formed.

(Etching Condition)

The flow ratio ($O_2/NH_3$) of the $O_2$ gas to the $NH_3$ gas is preferably from 0.5 to 20%. When the flow ratio $O_2/NH_3$ is not less than 0.5%, an effective $O_2$ operation is possible. Thus, a satisfactory CD shift value can be obtained, and less etching residue is formed. However, when the flow ratio $O_2/NH_3$ is greater than 20%, a bowing as shown in FIG. 4 is likely to be formed in the course of etching, which degrades a form of the etched part. More preferably, the flow ratio $O_2/NH_3$ is in the range of 5 to 10%. The flow ratio $O_2/NH_3$ greater than 5% enables a more satisfactory CD shift value. Furthermore, etching residue can be entirely eliminated.

In this etching step, a pressure in the processing vessel 2 is preferably less than 13.3 Pa. A pressure is not less than 13.3 Pa probably causes a generation of etching residue, which is disadvantageous. On the other hand, when a pressure in the processing vessel 2 is less than 2.7 Pa, it may be possible that the CD shift value takes an excessively large plus value (the top CD becomes too wide) to damage a form of the etched part. That is, a pressure in the processing vessel 2 is preferably not less than 2.7 Pa and less than 13.3 Pa, more preferably, not less than 6.7 Pa and less than 13.3 Pa.

A susceptor temperature during etching step is preferably from 0 to 20° C. When the susceptor temperature is lower than 0° C., etching speed is decelerated, and thus it may be possible that the CD shift value takes an excessively large minus value (the bottom CD becomes too small). On the other hand, when the susceptor temperature is higher than 20° C., etching speed is accelerated, and thus it may be possible that the CD shift value takes an excessively large plus value (the bottom CD becomes too large).

A residence time of the etching gas during the etching step is preferably in the range of 20 to 60 msec (milliseconds). When the residence time is longer than 60 msec, it may be possible that the CD shift value takes an excessively large plus value. On the other hand, when the residence time is shorter than 20 msec, etching speed is decelerated, and thus the CD shift value is prone to take an excessively large minus value.

The residence time herein means a period while the etching gas resides in an area of the processing vessel 2 in which the etching gas contributes to etching. Specifically, the residence time $\tau$ can be obtained by the following equation:

$$\tau = V/S = pV/Q (\text{sec})$$

wherein V ($m^3$) represents an effective processing space volume as a product of an area of the wafer W and a distance between the electrodes, and S ($m^3$/sec) represents a gas exhaust velocity from the processing vessel 2, p (Pa) represents a pressure in the processing vessel 2, and Q (Pa·$m^3$/sec) represents a total flow rate of the etching gas. (In the above equation, the reason for employing the effective processing space volume is that a gas contributing to etching is present in an effective processing space, while a gas which is present in a space outside the wafer does not contributes to etching.)

Etching is performed under the above-described conditions. After the lapse of time in which the organic material film 64 is over-etched 10 to 30% relative to "the time in which the organic material layer 64 is completely etched", the etching step is finished.

[Experiments]

Experiments conducted to demonstrate the effects of the present invention will be described hereinbelow.

The structure shown in FIG. 2 was etched to form a hole and a trench therein, by using the plasma etching system shown in FIG. 1. The common conditions were as follows: A 200 mm wafer was used as the wafer W. The organic material film 64 as a lower layer resist film having a thickness of 800 nm was etched, using the previously patterned photosensitive resist film 63 having a thickness of 310 nm as a mask. The top CD value (FIG. 2) before etching was 240 nm. A frequency of the high-frequency power source 40 was 60 MHz, while a frequency of the high-frequency power source 50 was 2 MHz.

As a comparative example, an experiment was carried out by using an etching gas containing mainly $O_2$. The conditions were: the susceptor temperature: 0° C.; a gap between the electrodes: 55 mm; a flow rate of the $O_2$ gas: 0.1 L/min; a pressure in the processing vessel: 2.0 to 3.3 Pa; power of the upper electrode: 500 W; power of the lower electrode: 150 W; and over-etching: 10%. The experiment has shown the following results. A satisfactory etching selectivity was shown, because a residual film amount at a flat part of the photosensitive resist layer 63 was 240 nm. No etching residue was found. However, the CD shift values were as large as +77 to 101 nm at a center portion, and +77 to 97 nm at an edge portion, and a bowing was formed.

Next, the pressure in the processing vessel was set at 2.7 Pa. As an etching gas, either (A) $N_2$ gas: 0.05 L/min or (B) CO gas: 0.05 L/min was added to the $O_2$ gas: 0.05 L/min. Other conditions were the same as the above conditions, and etching was performed. The experiment has shown the following results. In the experiment (A), the CD shift values were as large as +132 nm at a center portion and +133 nm at an edge portion, and a bowing was formed. Also in the experiment (B), the CD shift values were as large as +79 nm at a center portion and +72 at an edge portion, and a bowing was formed.

The results have shown that it is difficult to control a CD shift value at a desired value by means of the $O_2$-based gas.

Another comparative experiment was conducted in which a mixed gas containing the $N_2$ gas and the $H_2$ gas was used as an etching gas. The conditions were: an $N_2$ gas flow rate: 0.3 L/min; an $H_2$ gas flow rate: 0.3 L/min; a pressure in the processing vessel: 13.3 Pa; power of the upper electrode: 1000 W; power of the lower electrode: 100 W; and other conditions were the same as those of the above-described comparative experiment. The experiment has shown the following results. The CD shift values were as satisfactory as −2 nm at a center portion, and +3 nm at an edge portion. No etching residue was found. However, a residual film amount at a flat part of the photosensitive resist layer 63 was 200 nm. That is, an etching selectivity was deteriorated, so that a thickness of the photosensitive resist layer 63 became too small.

Another comparative experiment was carried out by using the $NH_3$ gas as an etching gas. The conditions were the same as in the above-described experiment in which the mixed gas containing the $N_2$ gas and the $H_2$ gas was used, except for an $NH_3$ flow rate: 0.3 L/min. The experiment has shown the following results. A satisfactory etching selectivity was shown, because a residual film amount at a flat part of the photosensitive resist layer 63 was 265 nm. However, there remained some etching residue. In addition, the CD shift values were −21 nm at a center portion, and −25 nm at an edge portion, which showed that the bottom CD was apt to be small.

Experiments in the scope of the present invention were carried out, by using a mixed gas containing the $NH_3$ gas and the $O_2$ gas as an etching gas. The common conditions were: a gap between the electrodes: 55 mm; power of the upper electrode: 1000 W; and power of the lower electrode: 100 W. Values of a flow ratio ($O_2/NH_3$) of the $O_2$ gas to the $NH_3$ gas, a pressure in the processing vessel, a susceptor temperature, and a residence time were set at different levels in each experiment.

At first, experiments were carried out under the conditions of: an $NH_3$ gas flow rate: 0.3 L/min; an $O_2$ gas flow rate: 0.03 L/min (a value of flow ratio $O_2/NH_3$: 10%); and a susceptor temperature: 0° C. A value of the pressure in the processing vessel was set at the different levels of (1) 10.0 Pa, (2) 13.3 Pa, and (3) 26.6 Pa, for the three experiments (1) to (3). The experiments have shown the following results. A satisfactory etching selectivity was shown in each experiment, because a residual film amount at a flat part of the photosensitive resist layer 63 was not less than 250 nm. CD shift values, values of a residual shoulder part, and a presence of etching residue were also examined. The results, as well as a residence time, are shown below. A residual shoulder part means, as shown in FIG. 5, a length of a linear part X below a shoulder part of the etched photosensitive resist layer 63. It is preferable that the residual shoulder part has a larger value.

(1) Pressure in Processing Vessel: 10.0 Pa
  Residence Time: 31.0 msec
  CD Shift Value
    Center Portion: −33 nm
    Edge Portion: −45 nm
  Residual shoulder part
    Center Portion: 36 nm
    Edge Portion: 59 nm
  Etching Residue: None
(2) Pressure in Processing Vessel: 13.3 Pa
  Residence Time: 41.4 msec
  CD Shift Value
    Center Portion: −13 nm
    Edge Portion: −30 nm
  Residual shoulder part
    Center Portion: 72 nm
    Edge Portion: 69 nm
  Etching Residue: Some
(3) Pressure in Processing Vessel: 26.6 Pa
  Residence Time: 82.7 msec
  CD Shift Value
    Center Portion: +19 nm
    Edge Portion 0 nm
  Residual shoulder part
    Center Portion: 83 nm
    Edge Portion: 49 nm
  Etching Residue: Much As apparent from above, when a pressure in the processing vessel was not less than 13.3 Pa, an etching residue was likely to be remained, while a pressure in the processing vessel was 10.0 Pa, no etching residue was found. Thus, a preferable pressure in the processing vessel is considered to be less than 13.3 Pa. However, when a pressure in the heat processing vessel was 10.0 Pa, the CD shift values were prone to show large minus values.

Then, experiments were carried out under the conditions of: an $NH_3$ gas flow rate: 0.3 L/min; and an $O_2$ gas flow rate: 0.03 L/min (a value of flow ratio $O_2/NH_3$:10%/o). A pressure in the processing vessel was set at 10.0 Pa, which shows a best result in the above experiments. A susceptor temperature was set at the different levels of (4) 0° C. (same as the above experiment (1)), (5) 10° C., and (6) 20° C., for the three experiments (4) to (6). The experiments have shown the following results. A satisfactory etching selectivity was shown in each experiment, because a residual film amount at a flat part of the photosensitive resist layer 63 was not less than 250 nm. The examined results of CD shift values, values of a residual shoulder part, and a presence of etching residue are shown below.

(4) Susceptor Temperature: 0° C.
  CD Shift Value
    Center Portion: −33 nm
      Edge Portion: −45 nm
    Residual shoulder part
    Center Portion: 36 nm
      Edge Portion: 59 nm
    Etching Residue: None
(5) Susceptor Temperature: 10° C.
  CD Shift Value
    Center Portion: −9 nm
      Edge Portion: −5 nm
    Residual shoulder part
    Center Portion: 56 nm
      Edge Portion: --
    Etching Residue: None
(6) Susceptor Temperature: 20° C.
  CD Shift Value
    Center Portion: +39 nm
      Edge Portion: +49 nm
    Residual shoulder part
    Center Portion: 85 nm
      Edge Portion: 127 nm
    Etching Residue: None As apparent from above, the CD shift values showed different values in accordance with different levels of the susceptor temperature. When the susceptor temperature was 0° C., the CD shift values were prone to show large minus values. However, as the susceptor temperature became higher, the CD shift values moved toward the plus value. When the susceptor temperature was 20° C., the CD shift values were prone to show large plus values. As a result, it is found that the susceptor temperature from 0 to 20° C. is preferable.

Experiments were carried out under the conditions of: a value of flow ratio $O_2/NH_3$:10%; a pressure in the processing vessel: 10.0 Pa; and a susceptor temperature: 10° C. Values of a total flow rate Q of the etching gas and a residence time τ thereof were set at different levels as described in the below items (7) to (9).

(7) Total Flow Rate: 0.165 L/min
  Residence Time: 62.1 msec
(8) Total Flow Rate: 0.330 L/min
  Residence Time: 31.0 msec
(9) Total Flow Rate: 0.495 L/min
  Residence Time: 20.7 msec The experiments have shown the following results. A satisfactory etching selectivity was shown in each experiment, because a residual film amount at a flat part of the photosensitive resist layer 63 was not less than 250 nm. The examined results of CD shift values, values of a residual shoulder part, and a presence of etching residue are shown below.

(7) CD Shift Value
    Center Portion: +51 nm
    Edge Portion: +53 nm
    Residual shoulder part
    Center Portion: --
      Edge Portion: --
    Etching Residue: None
(8) CD Shift Value
    Center Portion: −9 nm
    Edge Portion: −5 nm
    Residual shoulder part
    Center Portion: 56 nm
      Edge Portion: --
    Etching Residue: None
(9) CD Shift Value
    Center Portion: +11 nm
    Edge Portion: −18 nm
    Residual shoulder part
    Center Portion: 59 nm
      Edge Portion: 79 nm
    Etching Residue: Found in Trench Part As apparent from above, in the experiment (7) in which the residence time was more than 60 msec, the CD shift values were prone to take large plus values. In the experiment (9) in which the residence time was around 20 msec, the satisfactory CD shift values were shown, while a small quantity of etching residue was found in a trench part. As a result, when the residence time is less than 20 msec, it is expected that there generates significant etching residue.

Experiments were carried out under the condition that: an $NH_3$ gas flow rate was fixed to be 0.3 L/min; and an $O_2$ gas flow rate was set at the different levels of 0.03 L/min and 0.015 L/min. In accordance with the different levels of the $O_2$ gas flow rate, a flow ratio $O_2/NH_3$ was set at different values of (10) 10% and (11) 5%. Other conditions were that: a pressure in the processing vessel was 10.0 Pa; and a susceptor temperature was 10° C. The experiments have shown the following results. A satisfactory etching selectivity was shown in each experiment, because a residual film amount at a flat part of the photosensitive resist layer 63 was not less than 250 nm. The examined results of CD shift values, values of a residual shoulder part, and a presence of etching residue are shown below.

(10) $O_2/NH_3$: 10%
    CD Shift Value
    Center Portion: −9 nm
      Edge Portion: −5 nm
    Residual shoulder part
    Center Portion 56 nm
      Edge Portion: --
    Etching Residue: None
(11) $O_2/NH_3$: 5%
    CD Shift Value
    Center Portion: −10 nm
      Edge Portion: −10 nm
    Residual shoulder part
    Center Portion: 56 nm
      Edge Portion: 130 nm
    Etching Residue: None As apparent from above, when a value of $O_2/NH_3$ was not more than 10%, satisfactory results could be obtained. When a value of $O_2/NH_3$ is not more than 5%, it is expected that satisfactory CD shift values are obtained. However, when a value of $O_2/NH_3$ was 10%, a bowing was formed although it was negligible. As a result, a value of $O_2/NH_3$ is preferably not more than 20%, and more preferably, not more than 10%. Since an excessively reduced value of $O_2/NH_3$ causes an etching residue, it is preferable that a value of $O_2/NH_3$ is not less than 0.5%.

An experiment was carried out under the same conditions in the experiment (10) except for a pressure in the processing vessel. That is, in the experiment (12), a pressure in the processing vessel was reduced to be 6.7 Pa. The experiment has shown the following results. A satisfactory etching selectivity was shown, because a residual film amount at a flat part of the photosensitive resist layer 63 was not less than 250 nm. The examined results of CD shift values, values of a residual shoulder part, and a presence of etching residue are shown below.

(12) Pressure in Processing Vessel: 6.7 Pa
CD Shift Value
Center Portion: +13 nm
Edge Portion: +4 nm
Residual shoulder part
Center Portion: 92 nm
Edge Portion: 59 nm
Etching Residue: None As apparent from above, when a pressure in the processing vessel was reduced to be 6.7 Pa, the satisfactory result could be obtained. However, as a pressure in the processing vessel is reduced, the CD shift values are apt to be increased, which degrades a form of the etched part. As a result, a pressure in the processing vessel is preferably not less than 2.7 Pa.

Judging totally from above, it has been found that the best conditions are: an $NH_3$ gas flow rate: 0.3 L/min; an $O_2$ gas flow rate: 0.015 L/min (a value of flow ratio $O_2/NH_3$:5%); a susceptor temperature: 10° C.; and a pressure in the processing vessel: 10.0 Pa.

It should be noted that the present invention is not limited to the above embodiment, and various modifications and changes can be made.

For example, although a plasma etching system of a parallel flat-plate type, which performs etching by applying a high-frequency power to an upper electrode and a lower electrode, is used in the above embodiment, the present invention is not limited thereto. That is, a plasma etching system may be of a type which applies a high-frequency power either one of an upper electrode or lower electrode. Alternatively, the plasma etching system may be an RIE plasma etching system including a magnetron with an eternal magnet. Not limited to a capacitively coupled plasma etching system, various other etching systems, e.g., a system of inductively-coupled type, may be used. However, from a viewpoint of obtaining a higher etching selectivity at a suitable plasma density, a capacitively coupled plasma etching system is preferred. In the above embodiment, etching of a two-layered resist is illustrated. However, any etching of an organic material film is possible, as long as an Si-containing organic material film is used as a mask.

The invention claimed is:

1. A method of etching, by a plasma of an etching gas in a processing vessel, a lower layer film of an organic material formed on a substrate, using an upper layer film of an Si-containing organic material as a mask, wherein
a mixed gas containing an $NH_3$ gas and an $O_2$ gas is supplied into the processing vessel as the etching gas,
a CD shift value of etching is controlled by adjusting a flow ratio of the $O_2$ gas to the $NH_3$ gas,
the plasma is formed between a pair of opposed electrodes disposed in the processing vessel, and
a residence time represented by V/S takes a value from 20 to 60 msec, where V ($m^3$) represents an effective processing space volume as a product of an area of the substrate and a distance between the electrodes, and S ($m^3$/sec) represents a gas exhaust velocity from the processing vessel;
wherein the etching method is carried out by a capacitively coupled plasma etching system, which forms a high-frequency electric field between a pair of opposed electrodes disposed in the processing vessel to generate the plasma; and
further wherein the distance between the electrodes is such that a distance between a first of said electrodes and a wafer disposed on a second of said electrodes is from 30 to 90 mm.

2. The etching method according to claim 1, wherein a pressure in the processing vessel is not less than 2.7 Pa and less than 13.3 Pa.

3. The etching method according to claim 1, wherein a pressure in the processing vessel is not less than 6.7 Pa and less than 13.3 Pa.

4. The etching method according to claim 1, wherein a temperature of a support member supporting the substrate in the processing vessel is from 0 to 20° C.

5. The etching method according to claim 1, wherein the substrate has a surface layer to be etched with the lower layer film used as a mask, the surface layer being formed under the lower layer film.

6. A method of etching, by a plasma of an etching gas in a processing vessel, a lower layer film of an organic material formed on a substrate, using an upper layer film of an Si-containing organic material as a mask, wherein
a mixed gas containing an $NH_3$ gas and an $O_2$ gas is supplied into the processing vessel as the etching gas,
a flow ratio of the $O_2$ gas to the $NH_3$ gas is from 0.5 to 20%,
the plasma is formed between a pair of opposed electrodes disposed in the processing vessel, and
a residence time represented by V/S takes a value from 20 to 60 msec, where V ($m^3$) represents an effective processing space volume as a product of an area of the substrate and a distance between the electrodes, and S ($m^3$/sec) represents a gas exhaust velocity from the processing vessel;
wherein the etching method is carried out by a capacitively coupled plasma etching system, which forms a high-frequency electric field between a pair of opposed electrodes disposed in the processing vessel to generate the plasma; and
further wherein the distance between the electrodes is such that a distance between a first of said electrodes and a wafer disposed on a second of said electrodes is from 30 to 90 mm.

7. The etching method according to claim 6, wherein the flow ratio of the $O_2$ gas to the $NH_3$ gas is from 5 to 10%.

8. The etching method according to claim 6, wherein a pressure in the processing vessel is not less than 2.7 Pa and less than 13.3 Pa.

9. The etching method according to claim 6, wherein a pressure in the processing vessel is not less than 6.7 Pa and less than 13.3 Pa.

10. The etching method according to claim 6, wherein a temperature of a support member supporting the substrate in the processing vessel is from 0 to 20° C.

11. The etching method according to claim 6, wherein the substrate has a surface layer to be etched with the lower layer film used as a mask, the surface layer being formed under the lower layer film.

* * * * *